United States Patent
Fukunaga

(10) Patent No.: US 10,712,152 B2
(45) Date of Patent: Jul. 14, 2020

(54) OVERLAY ERROR MEASUREMENT DEVICE AND COMPUTER PROGRAM

(71) Applicant: Hitachi High-Technologies Corporation, Minato-ku, Tokyo (JP)

(72) Inventor: Fumihiko Fukunaga, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 0 days.

(21) Appl. No.: 16/070,969

(22) PCT Filed: Jan. 29, 2016

(86) PCT No.: PCT/JP2016/052560
§ 371 (c)(1),
(2) Date: Jul. 18, 2018

(87) PCT Pub. No.: WO2017/130365
PCT Pub. Date: Aug. 3, 2017

(65) Prior Publication Data
US 2019/0017817 A1  Jan. 17, 2019

(51) Int. Cl.
*H01J 37/28*  (2006.01)
*G01B 15/00*  (2006.01)
(Continued)

(52) U.S. Cl.
CPC .............. *G01B 15/00* (2013.01); *H01J 37/22* (2013.01); *H01J 37/222* (2013.01); *H01J 37/28* (2013.01);
(Continued)

(58) Field of Classification Search
CPC ..... G01B 15/00; G01B 2210/56; H01L 22/00; H01J 37/28; H01J 37/222; H01J 37/22; H01J 2237/2817
(Continued)

(56) References Cited

U.S. PATENT DOCUMENTS

| 5,412,210 A | 5/1995 | Todokoro et al. |
| 2009/0200465 A1* | 8/2009 | Sutani ............... H01J 37/265 250/311 |

(Continued)

FOREIGN PATENT DOCUMENTS

| JP | 5-290786 A | 11/1993 |
| JP | WO-2014181577 A1 * | 11/2014 |

(Continued)

OTHER PUBLICATIONS

International Search Report (PCT/ISA/210) issued in PCT Application No. PCT/JP2016/052560 dated May 24, 2016 with English translation (two (2) pages).
(Continued)

*Primary Examiner* — Michael Maskell
(74) *Attorney, Agent, or Firm* — Crowell & Moring LLP

(57) ABSTRACT

The purpose of the present invention is to provide an overlay error measurement device that is capable of accurately recognizing patterns and executing overlay error measurement, even when one pattern overlaps with another pattern in some areas but not in others. In order to do so, the present invention provides an overlay error measurement device provided with a calculating device for calculating overlay error. The overlay error measurement device is provided with an image designation device for designating a plurality of regions demarcated by luminance borders on an image. The calculating device recognizes, as a first pattern, a region in an image to be measured, corresponding to the plurality of regions demarcated by luminance borders, and uses the recognized first pattern to measure overlay error.

8 Claims, 11 Drawing Sheets

(51) Int. Cl.
*H01J 37/22* (2006.01)
*H01L 21/66* (2006.01)

(52) U.S. Cl.
CPC ... *G01B 2210/56* (2013.01); *H01J 2237/2817* (2013.01); *H01L 22/12* (2013.01)

(58) Field of Classification Search
USPC .................................. 250/306, 307, 310, 311
See application file for complete search history.

(56) References Cited

U.S. PATENT DOCUMENTS

| | | | |
|---|---|---|---|
| 2013/0100427 A1* | 4/2013 | Koolen | G03F 1/42 355/67 |
| 2014/0169657 A1* | 6/2014 | Harada | G01N 21/956 382/145 |
| 2014/0375793 A1* | 12/2014 | Harada | H01L 23/544 348/80 |
| 2015/0041649 A1* | 2/2015 | Wang | H01J 37/222 250/310 |
| 2015/0212019 A1* | 7/2015 | Shishido | G01B 15/04 250/307 |
| 2016/0056014 A1* | 2/2016 | Yamamoto | G03F 7/70633 250/307 |

FOREIGN PATENT DOCUMENTS

| | | | |
|---|---|---|---|
| JP | 5640027 B2 | 12/2014 | |
| JP | 2015-99054 A | 5/2015 | |
| WO | WO-2013129148 A1 * | 9/2013 | ............ H01J 37/222 |
| WO | WO 2014/181577 A1 | 11/2014 | |

OTHER PUBLICATIONS

Japanese-language Written Opinion (PCT/ISA/237) issued in PCT Application No. PCT/JP2016/052560 dated May 24, 2016 with English translation (three (3) pages).

* cited by examiner

[FIG. 1]
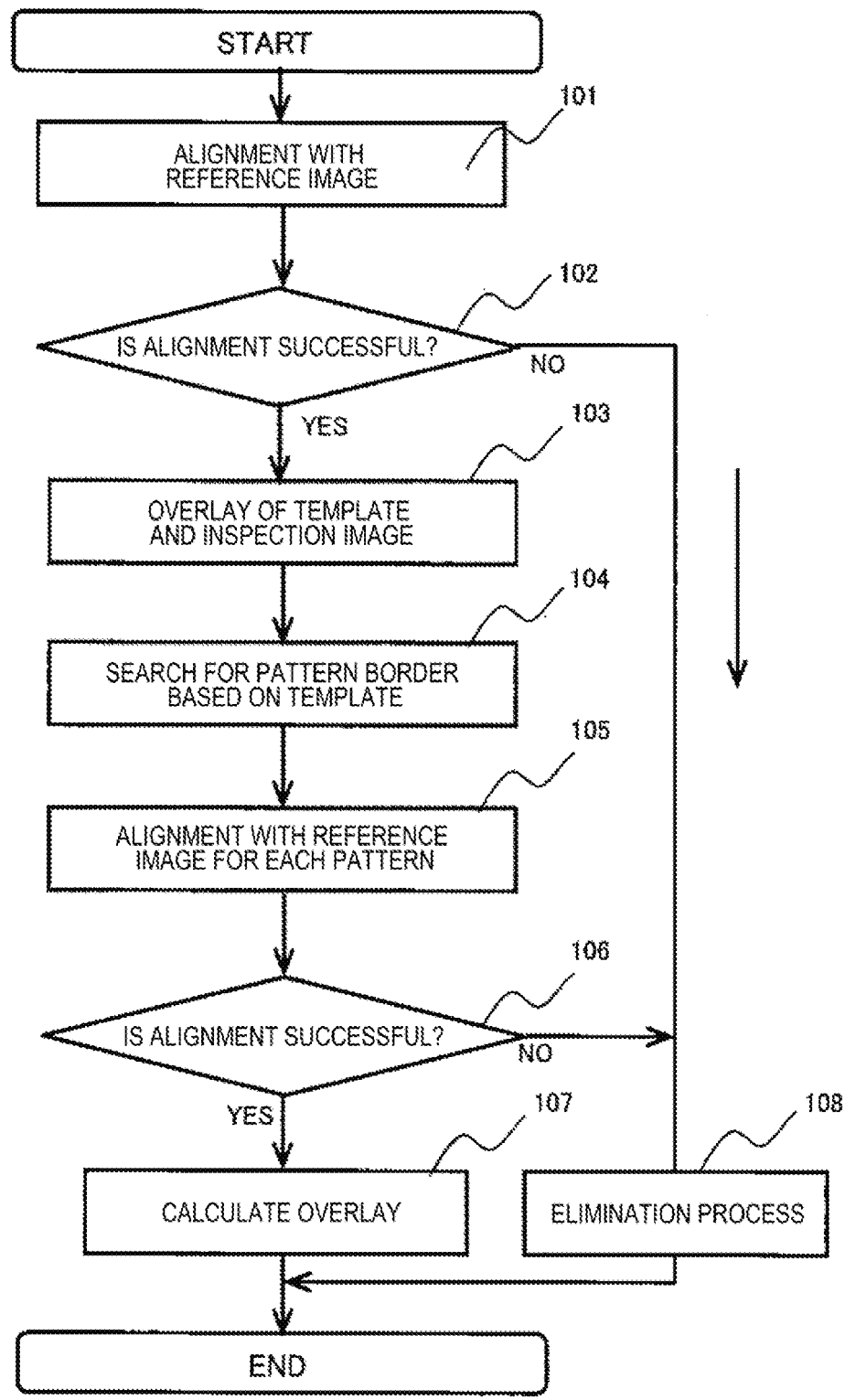

[FIG. 2]
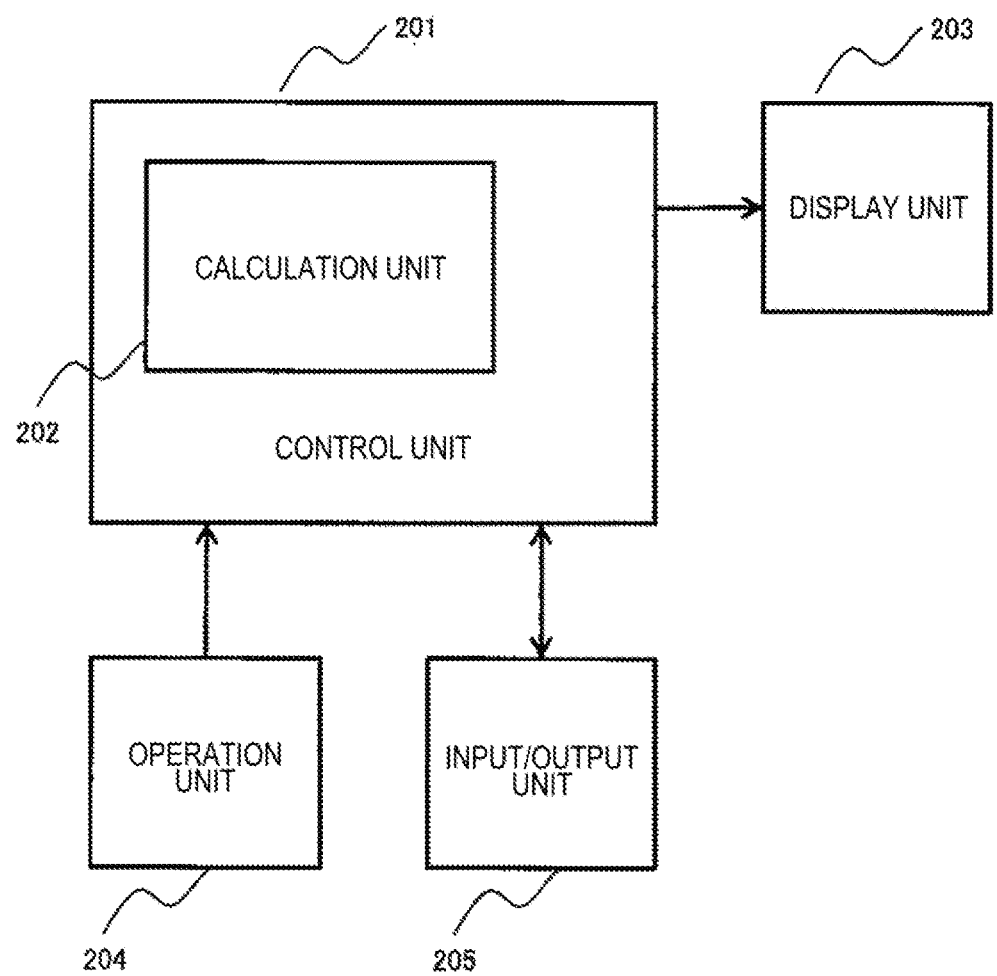

[FIG. 3]
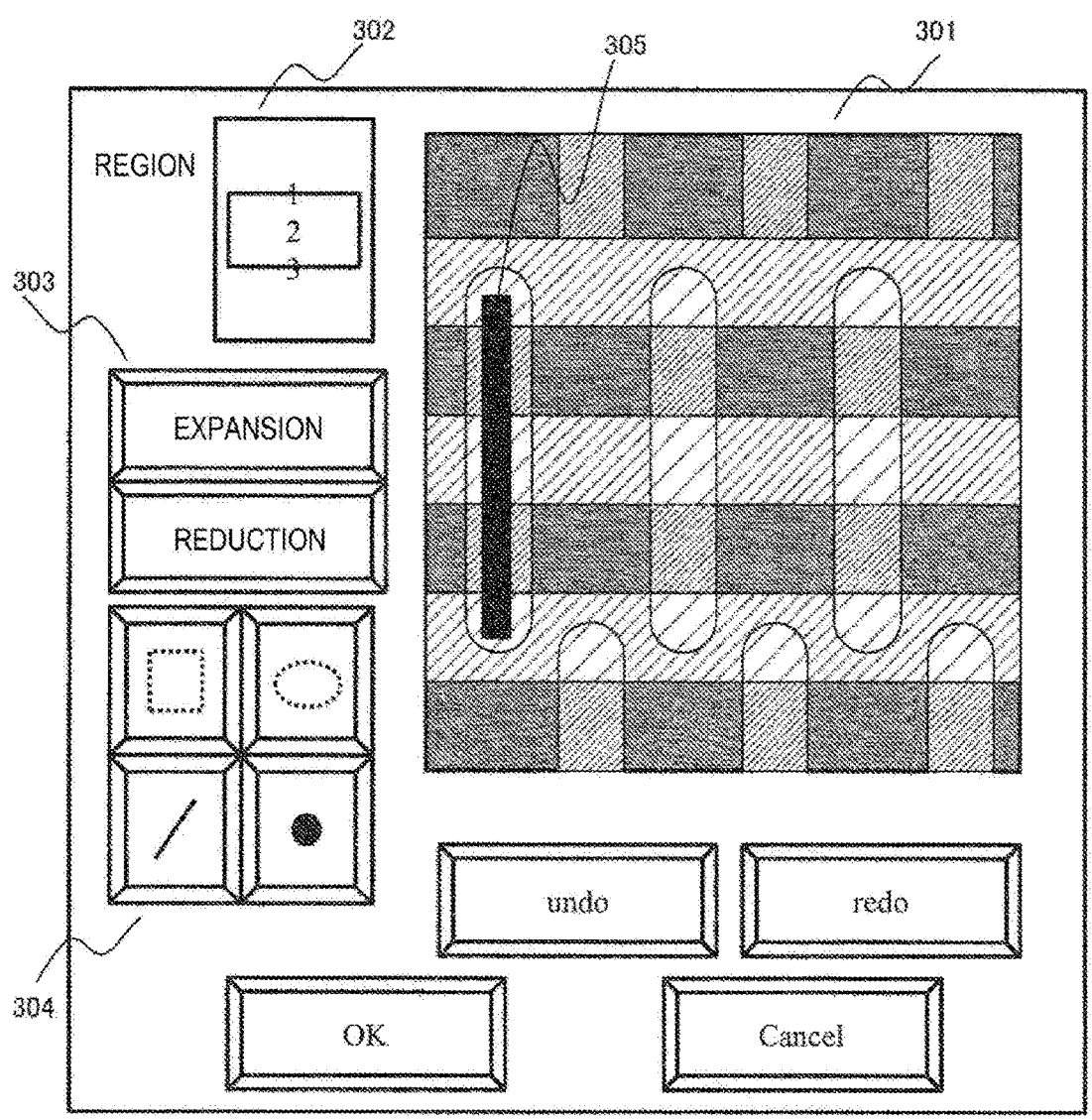

[FIG. 4]
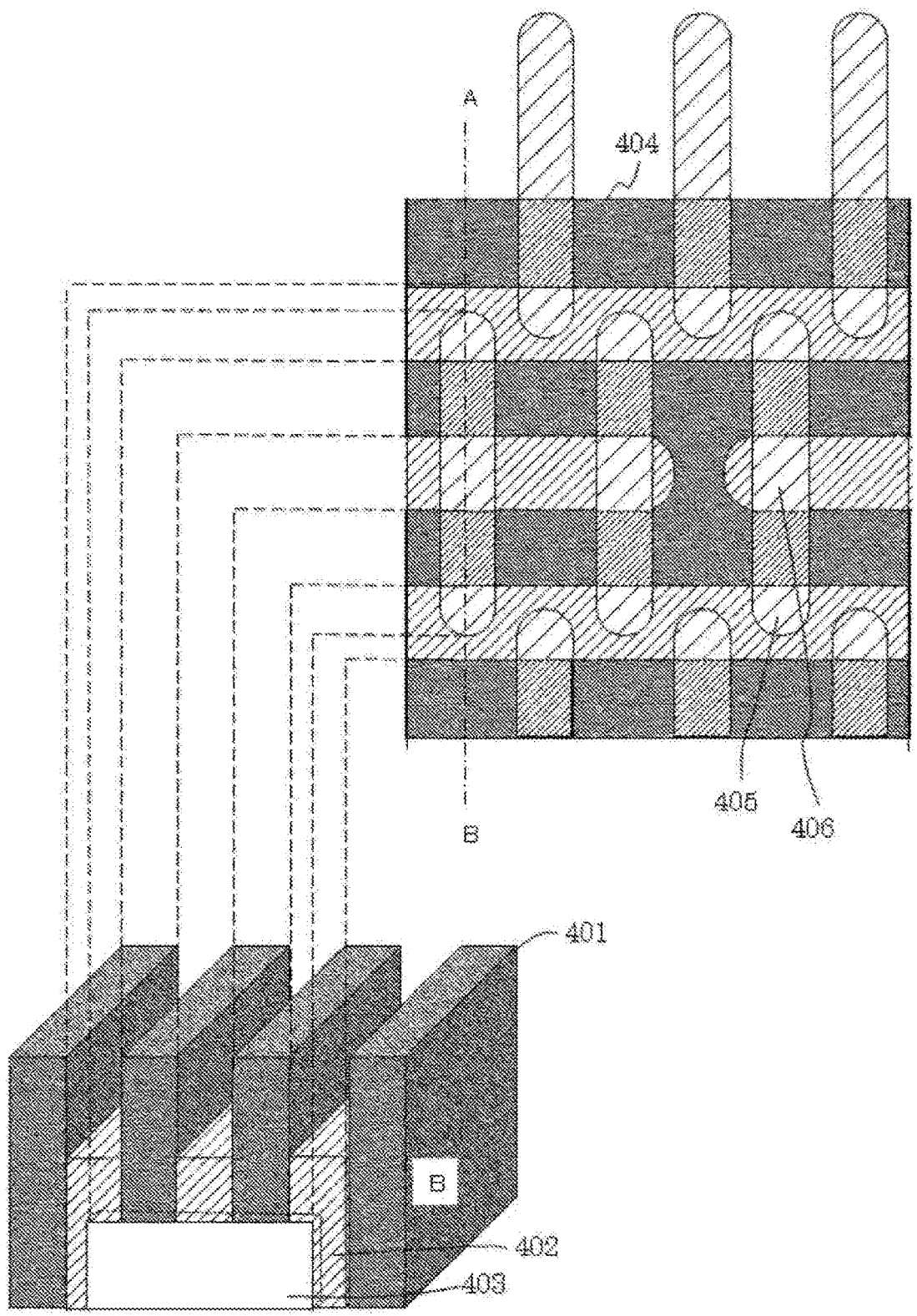

[FIG. 5]
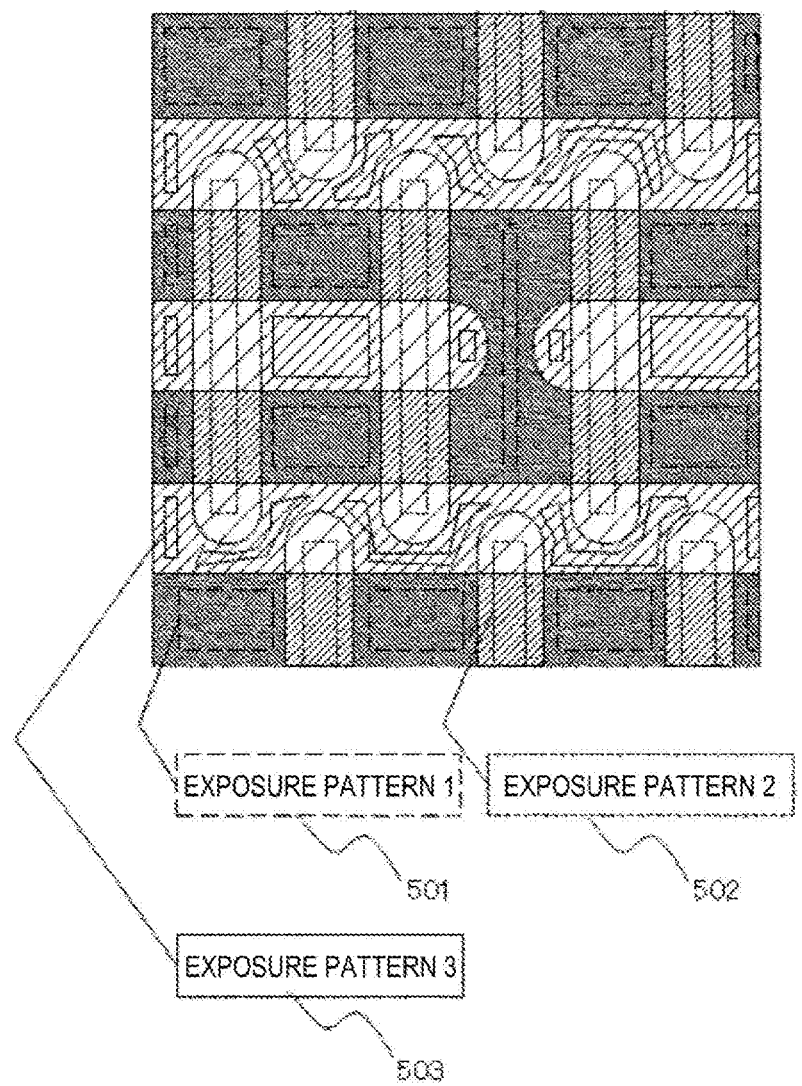

[FIG. 6]
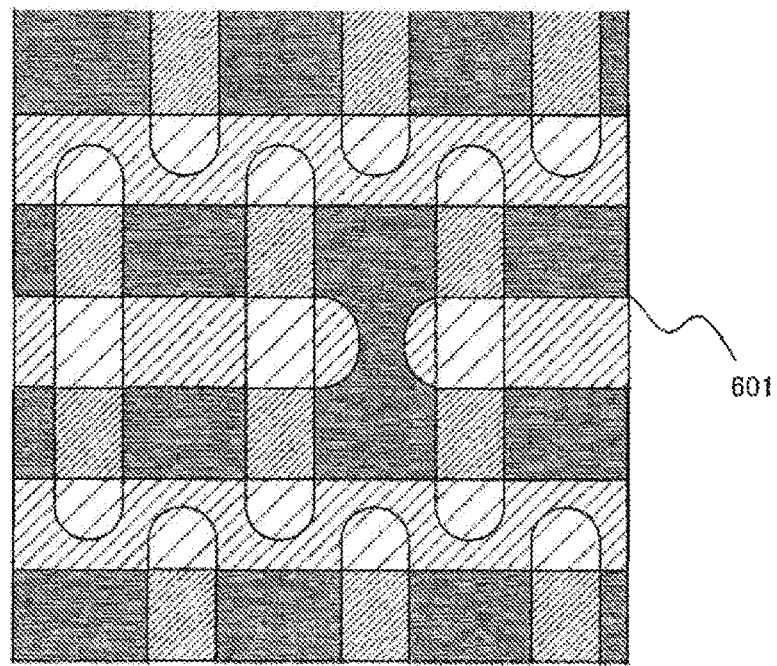
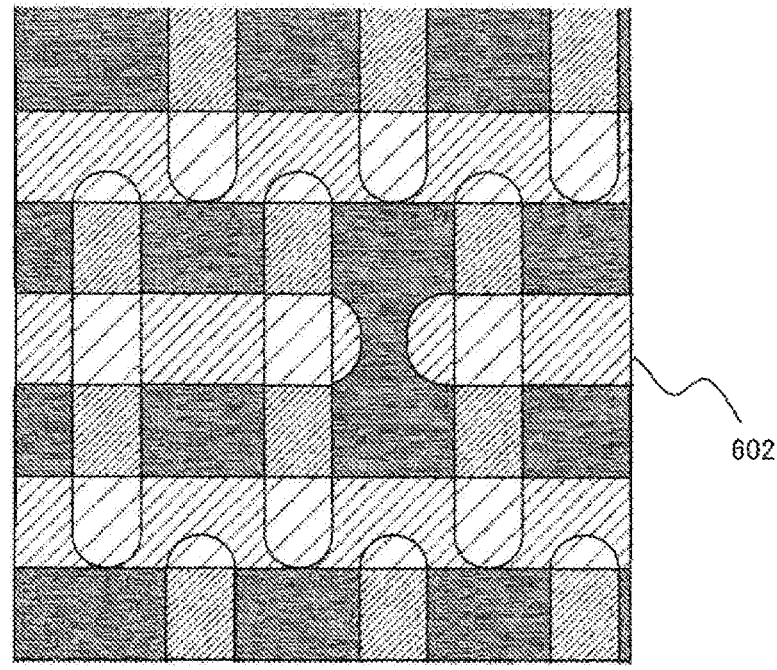

[FIG. 7]
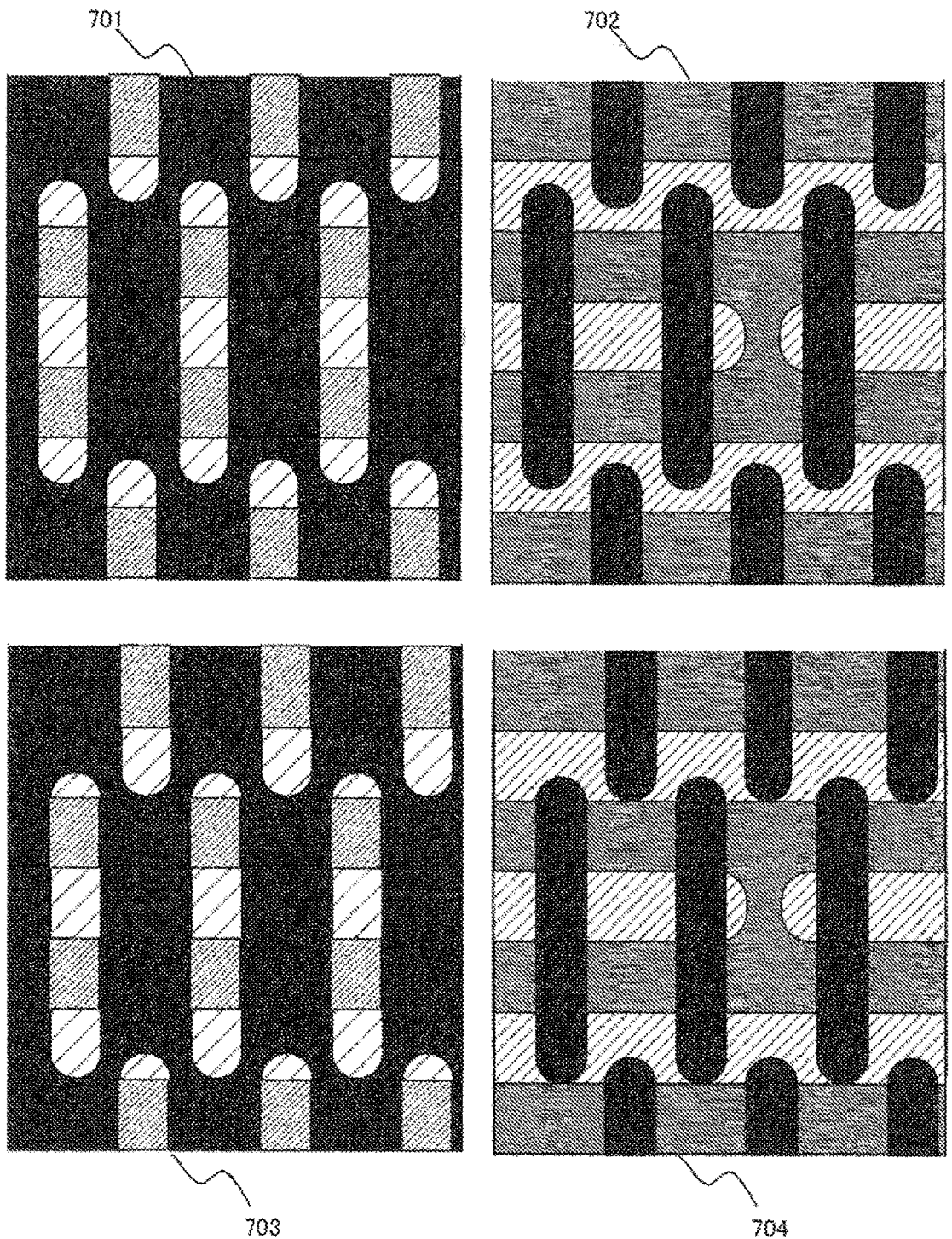

[FIG. 8]
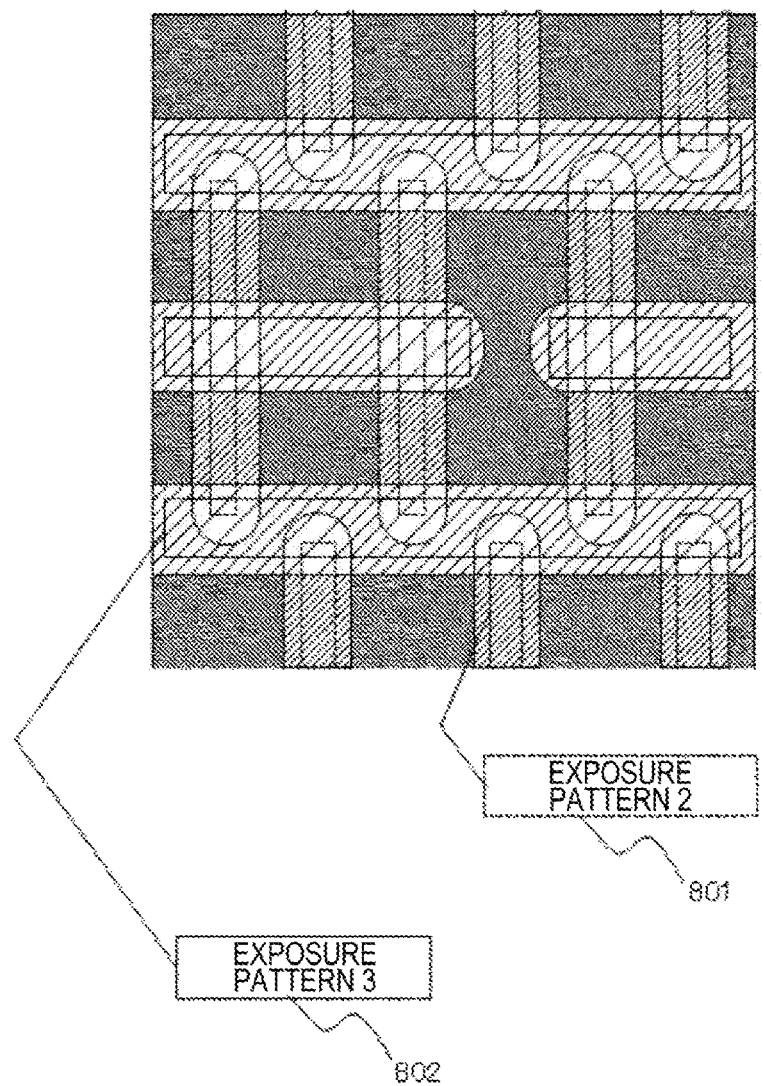

[FIG. 9]
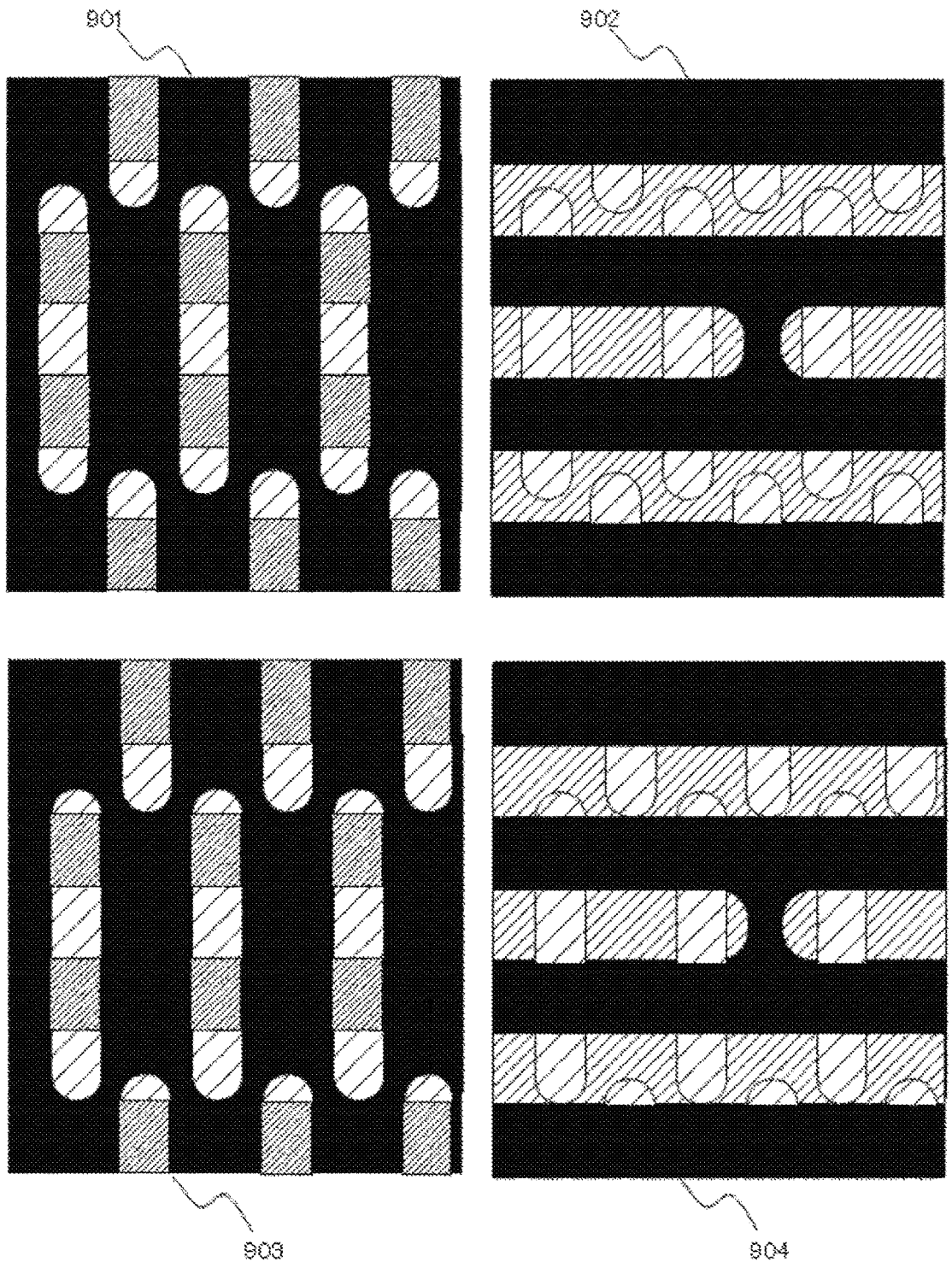

[FIG. 10]
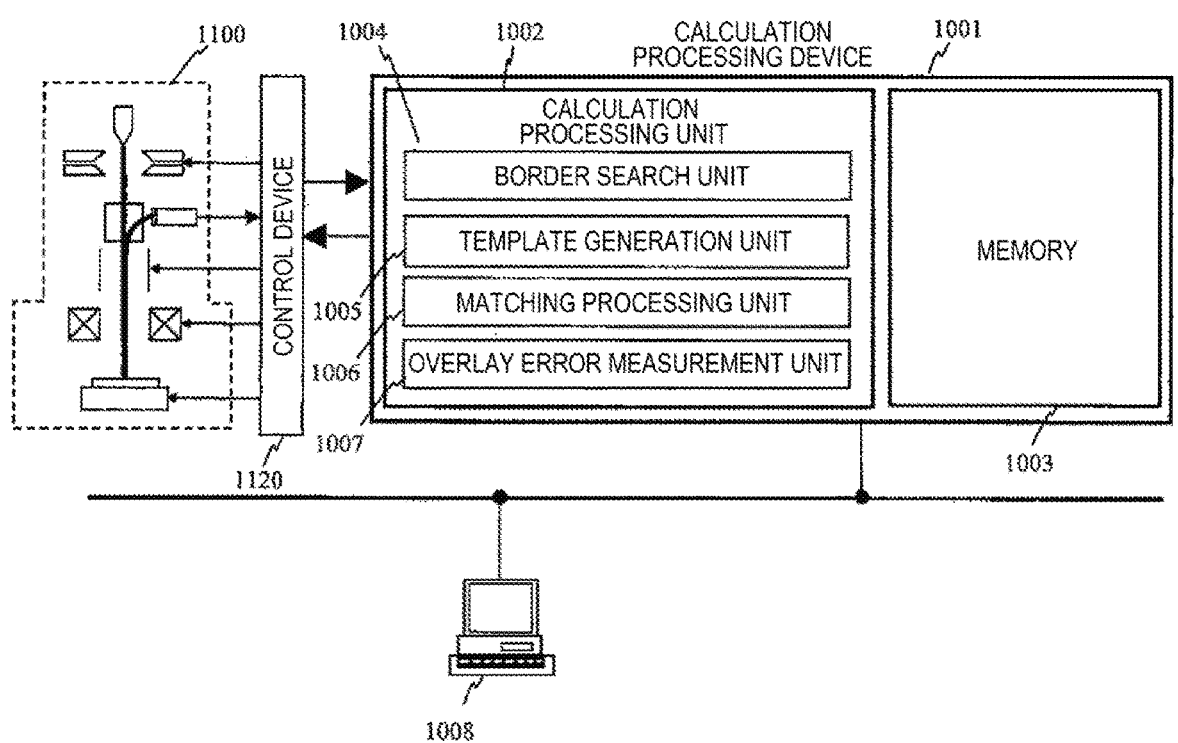

[FIG 11]
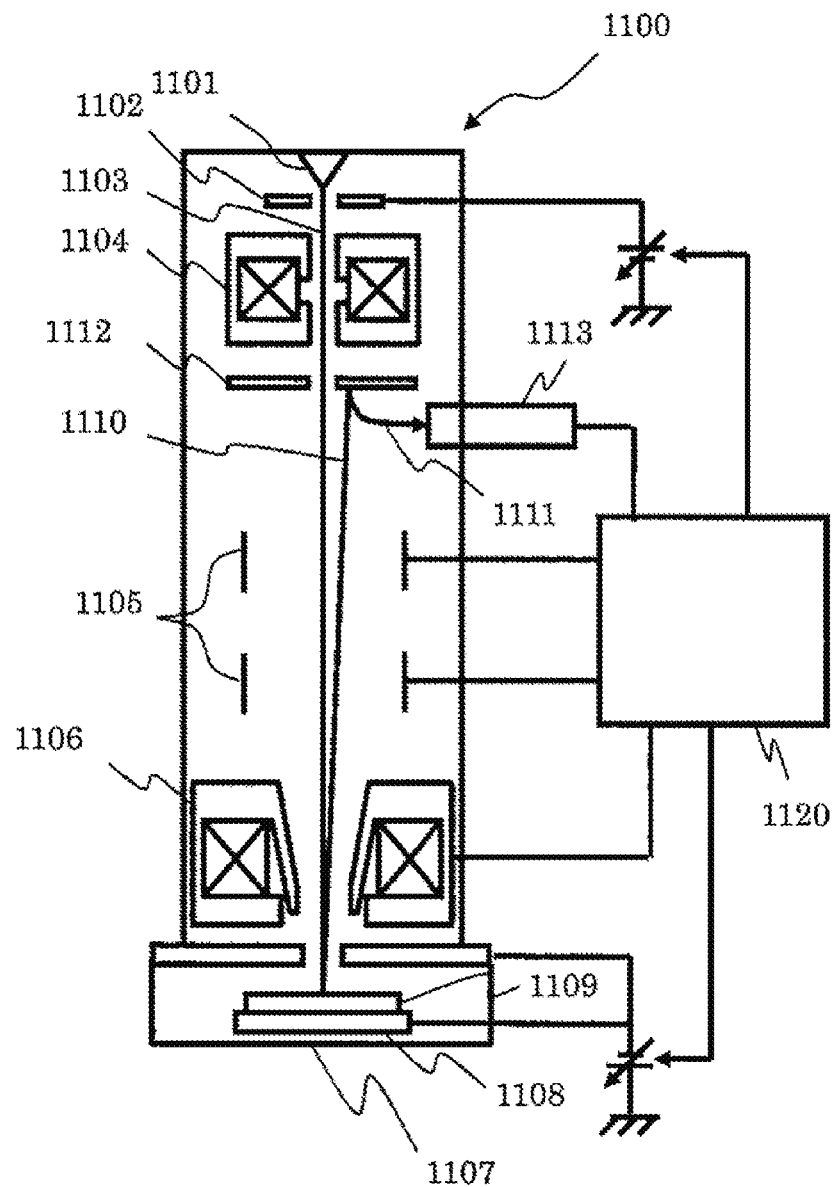

OVERLAY ERROR MEASUREMENT DEVICE AND COMPUTER PROGRAM

TECHNICAL FIELD

The present invention relates to an overlay error measurement device and a computer program, and more particularly to a measurement device and a computer program for measuring an overlay error based on an image obtained by a charged particle beam apparatus or the like.

BACKGROUND ART

Patterns manufactured by semiconductor processes in recent years have advanced in miniaturization and improvement of pattern overlay accuracy over multiple layers of an exposure apparatus is required. It is considered that the importance of measuring the overlay with high accuracy and feeding it back to the exposure apparatus will be more increased. PTL 1 discloses an electron microscope that measures an overlay error between patterns formed in different layers by overlaying a reference image and an image to be measured. Particularly, PTL 1 discloses a method of extracting a pattern for each layer according to a difference in luminance for each the reference image and the image to be measured, performing an overlay between the reference image and the image to be measured using a pattern matching method, and calculating a positional deviation between patterns of both the overlaid images. In addition, PTL 2 discloses a method of measuring a pattern located at a plurality of heights by detecting backscattered electrons or the like obtained when a sample is irradiated with a high-acceleration electron beam of 50 kV or higher. Specifically, a method of measuring a dimension between a pattern formed on the sample and a buried pattern using electrons emitted from a plurality of patterns located at different depths (heights) is disclosed.

CITATION LIST

Patent Literature

PTL 1: JP-B-5640027 (Corresponding to US Patent Publication No. US 2014/0375793)
PTL 2: JP-A-H5-290786 (Corresponding to U.S. Pat. No. 5,412,210)

SUMMARY OF INVENTION

Technical Problem

As disclosed in PTL 2, the electron beam reaches the buried pattern or the like which is not exposed on the sample surface by an increase of an acceleration energy (an energy of the beam reaching the sample) of the electron beam. If the electron beam reaches the buried pattern and reflected electrons and new electrons generated by the reflected electrons can be detected, even when the pattern is not exposed on the sample surface, the pattern can be imaged. On the other hand, in recent semiconductor processes, miniaturization further advances, and variations in degree of overlay are also increasing along with multilayer structuring. As a more specific example, even with the same pattern, there is a portion overlaying with another pattern or a portion not overlaying with another pattern. In this way, when the overlay condition with another pattern is different, even in the same pattern, the appearance on the image is different. In the pattern extracting method of PTL 1, it is not taken into consideration that the appearance differs from the non-overlay portion by overlaying with another pattern. In PTL 2, it is also not taken into consideration that the same pattern has a portion overlaying with another pattern and a portion not overlaying with another pattern.

Hereinafter, an overlay error measurement device and a computer program are proposed that can recognize accurately a pattern, and as a result, execute measurement with high accuracy even when one pattern has a portion overlaying with another pattern and a portion not overlaying with another pattern.

Solution to Problem

An aspect for achieving the above object provides an overlay error measurement device provided with a calculating device for calculating an overlay error between a plurality of patterns formed on a sample, the overlay error measurement device including an image designation device for designating a plurality of regions demarcated by luminance borders on an image, wherein the calculating device recognizes, as a first pattern, a region in an image to be measured, corresponding to the plurality of regions demarcated by the luminance borders, and performs overlay error measurement using the recognized first pattern. In addition, a computer program for causing a computer to execute a dimension calculation is provided.

Advantageous Effects of Invention

According to the above configuration, it is possible to realize overlay error measurement with high accuracy even when one pattern has a portion overlaying with another pattern and a portion not overlaying with another pattern.

BRIEF DESCRIPTION OF DRAWINGS

FIG. 1 is a flowchart illustrating an overlay error measurement process.
FIG. 2 is a block diagram illustrating an overview of an overlay error measurement device.
FIG. 3 is a diagram illustrating an example of a GUI screen for setting overlay error measurement conditions.
FIG. 4 is a diagram illustrating a part of a semiconductor device having a multilayer structure and an example of an SEM image.
FIG. 5 is a diagram illustrating an example in which a template portion serving as a reference for a border search is set in a reference image used for overlay error measurement.
FIG. 6 is a diagram illustrating an example of the reference image used for the overlay error measurement and an image to be measured.
FIG. 7 is a diagram illustrating an example of an image on which a pattern recognizing process is performed based on the border search.
FIG. 8 is a diagram illustrating an example in which a template serving as a starting point of the border search is set while being overlaid.
FIG. 9 is a diagram illustrating an example of an image that is pattern-recognized based on a template setting.
FIG. 10 is a diagram illustrating an example of a scanning electron microscope system.
FIG. 11 is a diagram illustrating scanning electron microscope.

DESCRIPTION OF EMBODIMENTS

An overlay error measurement device, a computer program for causing a computer to execute the overlay error measurement, and a storage medium for the computer program will be described below with reference to the drawings. In the embodiment to be described below, a device for performing overlay error measurement based on an image acquired by a charged particle beam apparatus and a computer program will be described.

When an acceleration voltage of an electron beam of an SEM for capturing an image of a semiconductor wafer is increased, the electron beam passes and an image as illustrated in FIG. 4 is obtained for a lower layer exposure pattern. A semiconductor sample illustrated in FIG. 4 includes a plurality of upper layer patterns 401 formed with a plurality of trenches (groove-like patterns) therebetween, a pattern 402 located at a bottom of the trench, and a pattern 403 located at a lower layer of the pattern 401 and formed long in a direction orthogonal to a longitudinal direction of the pattern 401. The patterns 401 to 403 are displayed in an SEM image 404. With the electron beam of low acceleration, the electron beam can hardly reach the pattern 403 not exposed on the sample surface, and the pattern 403 is not displayed; however, when an electron beam of high acceleration is irradiated, the electron beam penetrates through the patterns 401 and 402 and reaches the pattern 403, whereby the pattern 403 is displayed.

On the other hand, the pattern 401 is located at an upper layer of a portion 405 which is a part of the pattern 403, and the pattern 402 is located at an upper layer of a portion 406 which is a part of the pattern 403. Since the amount of electrons to be emitted, that is, brightness of the image varies depending on the presence or absence and the thickness and material of the layer through which the electron beam passes, one exposure pattern (pattern 403) is drawn with a plurality of image gray levels. That is, the patterns are hardly to be recognized only by luminance information.

In the embodiment to be described below, even when the pattern to be an object of the overlay error measurement includes a plurality of different luminance regions, a device capable of providing the pattern including the different luminance regions for the overlay error measurement and a computer program will be described.

Even in a pattern including a plurality of different luminance (image gray level) regions and difficult to recognize as one pattern, in order to provide for the overlay error measurement as the one pattern, as illustrated in FIG. 5, a template corresponding to an exposure pattern is created in advance on the reference image, based on designation that the plurality of image gray level regions are connected. After alignment between an inspection image (an image to be measured with overlay error measurement) and the reference image, the amount of deviation between the inspection image and the reference image is corrected, the template is overlaid on the inspection image, and a pattern border on the inspection image is obtained using the pattern region indicated in the template as a starting point. More specifically, on a display device on which the reference image is displayed, a plurality of regions (for example, portions 405 and 406 in FIG. 4) demarcated by the luminance borders on the image are designated using a pointing device or the like. Image regions to be measured corresponding to the plurality of demarcated regions according to the designated luminance border are recognized as a first pattern after the overlay of the reference image and the inspection image. Then the overlay error measurement is performed using the recognize first pattern.

According to the method described above, it is possible to perform overlay measurement for a transmission image due to a high acceleration electron beam or the like.

FIG. 11 is a diagram illustrating an outline of a scanning electron microscope (SEM) 1100 which is a type of a charged particle beam apparatus. An electron beam 1103 extracted from an electron source 1101 by an extraction electrode 1102 and accelerated by an acceleration electrode (not illustrated) is focused by a condenser lens 1104 which is one form of a focusing lens, and then is scanned one-dimensionally or two-dimensionally onto a sample 1109 by a scanning deflector 1105. The electron beam 1103 is decelerated by a negative voltage applied to an electrode built in a sample stage 1108, and is irradiated onto the sample 1109 by being focused by the lens action of an objective lens 1106.

When the sample 1109 is irradiated with the electron beam 1103, electrons 1110 such as secondary electrons and backscattered electrons are emitted from the irradiation point. The emitted electrons 1110 are accelerated toward the electron source by acceleration action based on a negative voltage applied to the sample, collide with a conversion electrode 1112, and generate secondary electrons 1111. The secondary electrons 1111 emitted from the conversion electrode 1112 are captured by a detector 1113, and an output of the detector 1113 changes according to the amount of captured secondary electrons. According to the output, luminance of a display device (not illustrated) changes. For example, in a case where a two-dimensional image is formed, an image of a scanning region is formed by synchronization of a deflection signal to the scanning deflector 1105 with the output of the detector 1113.

The scanning electron microscope illustrated in FIG. 11 is a device capable of applying a high voltage (for example, 15 kV or higher) to an acceleration electrode (not illustrated), and allowing the electron beam to reach a buried pattern or the like, which is not exposed onto the sample surface, by irradiation of the electron beam with a high acceleration. In the example of FIG. 1, an example is described in which electrons emitted from the sample are converted at one end into the conversion electrode and then are detected, but is not naturally limited to such a configuration. It is possible to employ, for example, a configuration in which an electron multiplier tube or a detection surface of the detector is disposed on the trajectory of accelerated electrons.

The control device 1120 controls each configuration of the scanning electron microscope and also has a function of forming an image based on the detected electrons and a function of measuring a pattern width of a pattern formed on the sample, based on the intensity distribution of the detected electrons called a line profile. In addition, the control device 1120 includes therein an SEM control device that mainly controls optical conditions of the SEM and a signal processing device that performs signal processing of the detection signal obtained by the detector 1113. The SEM control device includes a scanning control device that is used to control scanning conditions (direction, speed, and the like) of the beam. Further, the control device 1120 includes a storage medium (not illustrated) therein, and a program for causing a computer (CPU) to execute image processing and calculation as will be described below is stored.

The image processing unit includes an image memory. The image memory is a memory that stores 256 gradations in a depth direction, for example, in 1024×1024 pixels. Based on a signal output from the SEM control device, writing of a signal for each address (pixel) is performed. By synchronization of an address signal corresponding to a memory position of the image memory with an irradiation position of the beam, the irradiation position of the beam and the write coordinates match with each other. A signal read out corresponding to the address is converted from an analog to a digital by an AD converter, and becomes a luminance modulation input of the image display device. In the control device 120, integration processing is performed to integrate image data obtained based on several scanning. The integration processing is performed by averaging signals obtained by a plurality of frames for each pixel, for example.

FIG. 1 is a flowchart illustrating a process in which a template is created using a reference image, a region to be subjected to overlay error measurement is recognized out of the image to be measured, based on the overlay of the reference image including the template information and the image to be measured, and the overlay error measurement is executed based on the recognition. FIG. 2 is a diagram illustrating an example of an overlay error measurement device. The overlay error measurement device illustrated in FIG. 2 includes an input/output unit 205 that inputs image information from an image generation device similar to the scanning electron microscope illustrated in FIG. 11 and outputs measurement results and the like, an operation unit 204 that inputs necessary information from a GUI image, a control unit 201 including a calculation unit 202 that executes calculation processing required for measurement based on the image information input from the input/output unit 205 and measurement condition information input from the operation unit 204, and a display unit 203 that displays images obtained by the scanning electron microscope, measurement results obtained based on the images, and GUI images, for example.

In order to perform the overlay error measurement, first, the reference image and the inspection image are read from the input/output unit 205 into the calculation unit 201, and alignment is performed between the reference image and the inspection image (step 101). The matching degree is evaluated based on the matching degree and the normalized correlation of the image gray while the reference image and the inspection image are relatively shifted, and the alignment is performed at a position at which the matching degree is highest, for example. When the alignment has failed (for example, when the matching degree does not satisfy a predetermined condition, or when a plurality of matching candidate positions are extracted), the process proceeds to an elimination process (step 108) so as not to output an erroneous measurement result.

When the alignment is successful, the template registered together with the reference image is also in a state of being overlaid on the inspection image (step 103).

An example of the template is illustrated in FIG. 5. A region is designated so as to connect portions, such as exposure patterns 2 (502) enclosed by a short dashed line, where the pattern is drawn with a plurality of image gray levels. A template may be or may not be designated for portions, such as exposure patterns 1 (501) and 3 (503), which are drawn with a single gray level. The template is set in advance using the reference image, and is stored together with the reference image. In a case of creating the template, the template is designated to connect regions belonging to a single pattern but being represented by a plurality of luminance (image gray level). The exposure pattern 2 (502) illustrated in FIG. 5 is set so as to connect two different luminance regions by setting one rectangular region, but may be set to designate one point in the region in units of one luminance region rather than such the rectangular designation and to perform a border search, which will be described below, for each region after the designation. Since a plurality of luminance regions are recognized by the border search, pattern recognition to be described below may be performed by grouping of the luminance regions.

Next, a pattern border is searched from the exposure pattern region of the template overlaid on the inspection image (step 104), and for the border search, a Graph cuts method, a Random Walker method, or the like is used. As illustrated in FIG. 5, when the rectangular region (exposure pattern 2 (502)) extending over the plurality of luminance regions of one pattern on the image is set in advance, the border search can be performed using a reference point of each region as a starting point, and consequently, it is possible to recognize the whole pattern (if a part of the pattern appears in the image, corresponding to a part of the pattern), which is a reference of the overlay error measurement, from the other regions. By designation of a narrower region rather than the contour of the pattern as in the exposure pattern 2 (502), even if the size of the pattern has changed due to the change in magnification between the reference image and the image to be measured, it is possible to recognize the pattern based on the border search without mistaking it from other patterns.

When a plurality of luminance values of the plurality of luminance regions belonging to one pattern are known beforehand, the plurality of luminance values are designated, the designated luminance regions are searched within the image, and the search results are grouped, whereby the pattern recognition may be performed. In addition, when a plurality of patterns belonging to the same layer are included in one image and all of the patterns are selected, since luminance information to be selected is known by, for example, selection of the plurality of luminance regions of one pattern, another image region to be selected may be searched based on the selection information.

Since the pattern belonging to a specific layer can be recognized from other regions by the process described above, it is possible to separate the pattern at the obtained border. An example of separation is illustrated in FIG. 7. FIG. 7 is a diagram illustrating an example of performing the pattern recognizing process on both a reference image 601 and an inspection image 602 illustrated in FIG. 6. FIG. 7 illustrates a specific pattern (exposure pattern 2) image 701 recognized from the reference image, a region image 702 which is recognized from the reference image and is other than the specific pattern, a specific pattern image 703 recognized from the inspection image, and a region image 704 which is recognized from the inspection image and is other than the specific pattern.

Regarding the image generated as described above, the alignment of the reference image and the inspection image is performed for each of the specific pattern image and the region image other than the specific pattern (step 105). The alignment can be performed by, for example, a position alignment method of obtaining a position of the center of gravity of a pattern from a pattern shape and matching the position of the center of gravity and a method of calculating a matching position by obtaining the correlation of a plurality of pixel values using the normalized correlation. When the alignment fails, the process proceeds to the elimination process (step 108) so that erroneous measurement results are not output.

When the alignment is successful, the overlay error between the patterns can be obtained by calculating the difference of a positional deviation of the inspection image with respect to the reference image for each pattern (step 107). The overlay error can be obtained by performing the alignment process between the image 701 and the image 703, obtaining a relative positional deviation (dx2, dy2) required at the time, performing the alignment process between the image 702 and the image 704, obtaining a relative positional deviation (dx0, dy0) required at that time, and solving (dx2−dx0, dy2−dy0). This value is an overlay error between the specific pattern and other patterns.

FIG. 3 illustrates an example of a GUI (Graphical User Interface) screen for creating a template. The GUI screen illustrated in FIG. 3 is displayed on the display unit 203. A display frame 301 is provided on the GUI screen to display the reference image. The reference image stored in the storage medium (not illustrated) and selected and read according to an instruction of the operation unit 204 is displayed on the display frame 301. In the GUI screen, a region designation unit 302 is further displayed. The region designation unit 302 is provided to designate recognition ID of the pattern. The region designation unit 302 sets the recognition ID and then designates the region so as to connect the exposure patterns divided into the plurality of image gray levels. In the example of FIG. 3, a rectangular region 305 is designated so as to extend over all the plurality of luminance regions belonging to one pattern. The designated region may be painted out with transparent color for each color, or the contour thereof may be drawn.

When the recognition ID and the region selection information are registered in association with each other, it is possible to grant the recognition information that the rectangular region 305 belongs to a specific pattern and image regions of the image to be measured and the reference image extracted by the border search are specific pattern regions. In a case of setting a region for connecting a plurality of luminance regions, a shape such as a rectangle, an ellipse, or a straight line and a designation in freehand are selected by, for example, a set region shape setting unit 304, and the size thereof may be selected within the display frame 301 using a pointing device, for example. Further, the size of the set region may be set to an arbitrary size by a region size setting unit 303.

FIG. 10 is a diagram illustrating an outline of a scanning electron microscope system including the scanning electron microscope as illustrated in FIG. 11 and the overlay error measurement device as illustrated in FIG. 2. The scanning electron microscope system illustrated in FIG. 10 includes the scanning electron microscope 1100, the control device 1120 for controlling the scanning electron microscope, a calculation processing device 1001 (overlay error measurement device), and an input device 1008. The control device 1120 corresponds to the control unit 202 in FIG. 2, and the calculation processing device 1001 corresponds to the calculation unit 202 in FIG. 2. Further, the input device 1008 corresponds to the operation unit 204 and the input/output unit 205 in FIG. 2. The calculation processing device 1001 stores therein, for example, a control program (recipe) of the scanning electron microscope, image data, a recognition ID stored in association with the reference image, an image processing program used for the border search, a program used for the pattern matching processing or the like, and a calculation expression required for the overlay error measurement.

A border search unit 1002 executes border search processing of one pattern using a Graph cuts method or the like.

In addition, a template generation unit 1005 extracts pattern regions, which are obtained by region division, as a template. A matching processing unit 1006 executes alignment processing between the reference image and the image to be measured using the generated template. An overlay error measurement unit 1007 executes overlay error measurement using a calculation expression or the like stored in a memory 1003. A display device of the input device 1008 (image designation device) is configured such that the GUI screen or the like illustrated in FIG. 3 is displayed and an arbitrary region in the image can be set by a pointing device or the like.

It is also possible to allocate a part or all of the control or processing in the calculation processing device 1001 to a CPU or an electronic computer or the like having a memory capable of storing images and to perform processing and control. In addition, the control device 1102 and the calculation processing device 1001 may be configured as one calculating device.

Further, as illustrated in FIG. 8, templates corresponding to different patterns to be superimposed on the SEM image may be set so as to overlay with each other. In the example of FIG. 8, an exposure pattern 2 (801) is set so as to extend over a plurality of luminance regions included in the pattern formed long in the vertical direction on the paper surface, and an exposure pattern 3 (802) is set so as to extend over a plurality of luminance regions included in the pattern formed long in the horizontal direction on the paper surface. By performing pattern separation on the reference image and the image to be measured based on such setting, it is possible to perform alignment using the center of gravity for each of the exposure patterns 2 and 3. FIG. 9 is a diagram illustrating an example in which the pattern separation processing is performed for both the reference image and the image to be measured. FIG. 9 illustrates a first specific pattern image 901 recognized from the reference image, a second specific pattern image 902 recognized from the reference image, a first specific pattern image 903 recognized from the image to be measured, and a second specific pattern image 904 recognized from the image to be measured. A pattern size fluctuates due to etching variation and the like at the time of forming a circuit pattern of a semiconductor device, but it is possible to perform overlay measurement, which is not affected by the fluctuation of the pattern size, by evaluation of the center of gravity.

Measurement of the overlay measurement error with only a part of the pattern may cause the overlay error measurement result to change due to partial deformation of the pattern, but according to the above-described method capable of applying the entire pattern to the overlay error measurement, it is possible to perform overlay error measurement with high accuracy regardless of partial deformation or the like of the pattern.

REFERENCE SIGNS LIST

201: control unit
202: calculation unit
203: display unit
204: operation unit
205: input/output unit

The invention claimed is:
1. A system for measuring an overlay error between a plurality of patterns belonging to different layers included in an image data, the system comprising:

an imaging tool including a detector, a beam source and a lens that focuses a beam emitted by the beam source, and being configured to obtain an image for overlay error measurement;

an input device configured to designate a plurality of regions with different luminance in the image, the plurality of regions belonging to a first layer; and a computer including a processor, the processor being configured to execute program instructions stored in a memory, the program instructions being configured to cause the processor to:

receive the image for the overlay error measurement from the imaging tool, execute, for the received image, a border search for the plurality of regions designated by the input device, and measure the overlay error between a pattern defined by the border search for the plurality of regions and a second layer different from the first layer.

2. The overlay error measurement device according to claim 1, wherein
the calculating device performs the overlay error measurement using a reference image and an image to be measured.

3. The overlay error measurement device according to claim 2, wherein
the calculating device obtains the overlay error based on first positional deviation information between a reference image in which a first pattern is recognized and an image to be measured in which the first pattern is recognized and second positional deviation information between a reference image in which a region other than the first pattern or a second pattern other than the first pattern is recognized and an image to be measured in which the region other than the first pattern or the second pattern other than the first pattern is recognized.

4. The overlay error measurement device according to claim 3, wherein
the calculating device obtains the overlay error based on a difference calculation between the first positional deviation information and the second positional deviation information.

5. The overlay error measurement device according to claim 1, wherein
the calculating device performs the border search using the region designated by the image designation device as a starting point, and recognizes the pattern based on the border search.

6. The overlay error measurement device according to claim 5, wherein
the calculating device executes the border search on the image to be measured, based on starting point information of the border search stored in advance together with the reference image.

7. The overlay error measurement device according to claim 6, wherein
the calculating device performs alignment between the reference image and the image to be measured, and sets the starting point on the image to be measured based on the alignment.

8. A non-transitory computer-readable medium storing a program which, when executed, causes a computer to execute an overlay error measurement method between a plurality of patterns based on a signal obtained by a charged particle beam apparatus, the method comprising:

obtaining an image for an overlay error measurement;

designating, by an input device, a plurality of regions with different luminance in the image, the plurality of regions belonging to a first layer;

receiving the image for the overlay error measurement from an imaging tool;

executing, for the received image, a border search for the plurality of regions designated by the input device;

measuring the overlay error between a pattern defined by the border search for the plurality of regions and a second layer different from the first layer.

* * * * *